United States Patent
Haluzak et al.

(10) Patent No.: US 7,288,464 B2
(45) Date of Patent: Oct. 30, 2007

(54) MEMS PACKAGING STRUCTURE AND METHODS

(75) Inventors: Charles C. Haluzak, Corvallis, OR (US); Jeffrey R. Pollard, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 232 days.

(21) Appl. No.: 11/104,704

(22) Filed: Apr. 11, 2005

(65) Prior Publication Data

US 2006/0228869 A1    Oct. 12, 2006

(51) Int. Cl.
*H01L 21/30* (2006.01)

(52) U.S. Cl. .................. 438/455; 438/456; 257/774; 257/E21.122

(58) Field of Classification Search .......... 438/48, 438/51, 406, 455, 456, 458; 257/704, 774; 257/E21.122, E21.577
See application file for complete search history.

(56) References Cited

U.S. PATENT DOCUMENTS

| | | | |
|---|---|---|---|
| 5,427,975 A | 6/1995 | Sparks et al. | |
| 5,798,283 A | 8/1998 | Montague et al. | |
| 5,963,788 A | 10/1999 | Barron et al. | |
| 6,335,224 B1 | 1/2002 | Peterson et al. | |
| 6,337,027 B1 | 1/2002 | Humphrey | |
| 6,379,988 B1 | 4/2002 | Peterson et al. | |
| 6,425,971 B1 | 7/2002 | Silverbrook | |
| 6,502,306 B2 | 1/2003 | Silverbrook | |
| 6,531,331 B1 | 3/2003 | Bennett et al. | |
| 6,535,663 B1 | 3/2003 | Chertkow | |
| 6,569,701 B2 | 5/2003 | Knieser et al. | |
| 6,635,506 B2 | 10/2003 | Volant et al. | |
| 6,756,310 B2 | 6/2004 | Kretschmann et al. | |
| 6,770,506 B2 | 8/2004 | Gogoi | |
| 6,770,569 B2 | 8/2004 | Foerstner et al. | |
| 6,790,698 B2 | 9/2004 | Miller et al. | |
| 6,798,029 B2 | 9/2004 | Volant et al. | |
| 6,830,950 B2 | 12/2004 | Chinn et al. | |
| 6,838,302 B2 | 1/2005 | Huibers | |
| 6,844,623 B1 | 1/2005 | Peterson et al. | |
| 6,846,692 B2 | 1/2005 | Silverbrook | |
| 2002/0048839 A1 | 4/2002 | Miller et al. | |
| 2002/0146200 A1 | 10/2002 | Kudrle et al. | |
| 2002/0174541 A1 | 11/2002 | Silverbrook | |
| 2003/0060051 A1 | 3/2003 | Kretschmann et al. | |
| 2003/0082928 A1 | 5/2003 | Knieser et al. | |
| 2003/0134449 A1 | 7/2003 | Huibers | |
| 2003/0138986 A1 | 7/2003 | Bruner | |
| 2003/0139018 A1 | 7/2003 | Silverbrook | |
| 2003/0146464 A1 | 8/2003 | Prophet | |
| 2003/0153116 A1 | 8/2003 | Carley et al. | |

(Continued)

OTHER PUBLICATIONS

K. B. Lee et al. "Zinc Bonding for MEMS Packaging at the Wafer Level" MicroElectro-Mechanical Systems Systems (MEMS) 2001, IMECE2001 (ASME, New York) Nov. 11, 2001 pp. 707-710.

(Continued)

*Primary Examiner*—Brook Kebede
*Assistant Examiner*—Khiem D Nguyen

(57) ABSTRACT

A MEMS article is made by forming a MEMS device on a first substrate, providing a second substrate, depositing a layer of etchable dielectric material, forming at least one lateral post-bond release-etch port by a damascene process using a sacrificial material, and bonding the two substrates together.

45 Claims, 5 Drawing Sheets

U.S. PATENT DOCUMENTS

| | | |
|---|---|---|
| 2003/0166342 A1 | 9/2003 | Chinn et al. |
| 2003/0218227 A1 | 11/2003 | Singh et al. |
| 2004/0012057 A1 | 1/2004 | Bennett et al. |
| 2004/0012061 A1 | 1/2004 | Reid et al. |
| 2004/0023429 A1 | 2/2004 | Foerstner et al. |
| 2004/0033011 A1 | 2/2004 | Chertkow |
| 2004/0033639 A1 | 2/2004 | Chinn et al. |
| 2004/0053434 A1 | 3/2004 | Bruner |
| 2004/0065940 A1 | 4/2004 | Ayazi et al. |
| 2004/0119125 A1 | 6/2004 | Gogoi et al. |
| 2004/0121506 A1 | 6/2004 | Gogoi |
| 2004/0125346 A1 | 7/2004 | Huibers |
| 2004/0173886 A1* | 9/2004 | Carley ................... 257/678 |
| 2004/0263944 A1 | 12/2004 | Miles et al. |
| 2005/0002084 A1 | 1/2005 | Wan |
| 2005/0007217 A1 | 1/2005 | Deligianni et al. |
| 2006/0076311 A1* | 4/2006 | Tung et al. ................ 216/24 |

OTHER PUBLICATIONS

K. Gilleo, "MEMS, MOEMS and Optoelectronics" MicroElectro-Mechanical Systems Systems (MEMS) 2001. IMECE2001 (ASME, New York) Nov. 11, 2001 pp. 711-718.

L. Hornbeck et al. "Digital Micromirror Device—Commercialization . . . " MicroElectro-Mechanical Systems Systems (MEMS) 1997, DSC-vol. 62 (ASME, Dallas, TX) Nov. 16, 1997 pp. 3-8.

K. D. Wise, "Micromechanical Sensors, Actuators and Systems" Micromechanical Sensors, Actuators, and Systems, DSC-vol. 32 (ASME, Atlanta, GA) Nov. 1-6, 1991 pp. 1-14.

L. Field et al. "Fusing Silicon Wafers with Low Melting Temperature Glass" Transducers '89 Jun. 1990, reprinted in Micromechanics and MEMS, IEEE, New York (1991) pp. 592-595.

M. Esashi et al. "Low-temperature Silicon-to-silicon Anodic Bonding . . . " Transducers '89 Jun. 1990, reprinted in Micromechanics and MEMS, IEEE Press, New York (1991) pp. 588-591.

P. Barth, "Silicon Fusion Bonding for Fabrication of Sensors, Actuators . . . " Transducers '89 Jun. 1990. reprinted in Micromechanics and MEMS, IEEE, New York (1991) pp. 596-603.

K. Petersen et al. "Silicon Fusion Bonding for Pressure Sensors" Jun. 1988. reprinted in Micromechanics and MEMS, IEEE Press, New York (1991) pp. 584-587.

G. Kaminsky "Micromachining of Silicon Mechanical Structures" Jul./Aug. 1985 reprinted in Micromechanics and MEMS, IEEE Press, New York (1991) pp. 555-583.

K. Petersen "Micromechanical Membrane Switches on Silicon" IBM J. Res. Develop. V.23/4 (Jul. 1979) pp. 376-385.

* cited by examiner

MEMS PACKAGING STRUCTURE AND METHODS

CROSS-REFERENCE TO RELATED APPLICATION

This application is related to and commonly assigned application Ser. No. 11/110,132, filed Apr. 19, 2005.

TECHNICAL FIELD

This invention relates generally to microfabrication methods, and more particularly to methods for making micro-electro-mechanical (MEMS) articles and to the MEMS articles made.

BACKGROUND

In fabrication of microelectromechanical system (MEMS), deflectable or movable structures are typically produced by etching features into a device layer, using silicon processing techniques common to the semiconductor industry to form the structure's form. The deflectable structures are often held immobile initially by a layer of sacrificial material. Typically, the layer of sacrificial material underlies the deflectable or movable structure. The underlying sacrificial layer is subsequently removed (e.g., by preferential etching) in a release process to produce a suspended deflectable structure or, in some cases, a free element. Often the structural device layer is silicon, a silicon compound, a metal, or an alloy. Various sacrificial materials such as silicon dioxide, photoresist, polyimide, epoxy, wax, polysilicon, and amorphous silicon have been used for the sacrificial layer. Some MEMS devices are made by using two or more sacrificial materials for support, immobilization, and/or release of different structures of the MEMS device, which may have more than one structural device layer. The various sacrificial materials may be removed by the same etch process or by different selective etch processes. For example, a first sacrificial material or a portion of it may be removed by a wet etch and a second sacrificial material and/or a remaining portion of the first sacrificial material may be removed by a plasma etch.

Some specific sacrificial materials and etchants that have been used with the sacrificial materials include silicon oxide, removed, e.g., by hydrofluoric acid (HF) or buffered HF etching; amorphous silicon, removed, e.g., by xenon difluoride ($XeF_2$) etching; and organic materials such as photoresist removed by oxygen plasma ashing.

After release by removal of the sacrificial material(s), the MEMS structures may be subject to ambient conditions which can lead to particulate and chemical contamination while the MEMS wafer is being stored, being inspected, or being prepared for packaging. Standard practice in MEMS fabrication often includes enclosing the MEMS devices within a package that protects the MEMS devices from environmental effects after MEMS release. The package may be hermetic, and the MEMS fabrication process may include bonding.

It has been reported that the greatest single cause of yield problems in fabrication of MEMS structures is "stiction," unwanted adhesion of a MEMS structural element to another surface. Various coating materials have been employed to help prevent stiction. Such anti-stiction coatings are commonly applied after release of the MEMS device structures. Some anti-stiction coatings that have been used include amorphous hydrogenated carbon, perfluoropolyethers, perfluorodecanoic acid, polytetrafluoroethylene (PTFE), diamond-like carbon, and an alkyltrichlorosilane monolayer lubricant. Dessicants are also sometimes used in MEMS packages to help keep moisture away from device structures.

When bonding of a package seal occurs after MEMS release, packaging processes, including desiccant introduction or anti-stiction coating can lead to particulate generation and chemical contaminants on the MEMS devices.

Other steps of many packaging procedures may require processes that can also adversely affect the MEMS structures if they are in a fully released state. For example, soldering or anodic bonding can lead to thermally or electrically induced strain and/or bending in the MEMS structures. Radiation, e.g., ultraviolet (UV) radiation used for curing epoxies, has the potential to damage fragile circuits through solid-state interactions with high-energy photons and can indirectly lead to heating, causing problems as described with reference to soldering or anodic bonding. High electric fields, such as the fields that may occur in anodic bonding, can damage MEMS by causing "snapdown," charge-trapping, and other unwanted electrical phenomena. Outgassing of organic materials, e.g., in adhesive curing, can lead to surface adsorbed contamination of sensitive MEMS areas causing corrosion, stiction, charge-trapping, or other dielectric-related phenomena. Deposition of an anti-stiction coating after MEMS release, but before plasma-assisted bonding, may lead to fouling of the bonding surfaces. Conversely, high-temperature bonding processes may adversely affect the anti-stiction coating. Thus, if the anti-stiction coating is placed in or on the MEMS device after release, but before package seal bonding, process integration problems may arise, such as surfaces that will no longer bond, or, an anti-stiction coating that loses functionality for the MEMS due to thermally induced chemical changes.

Thus, an improved MEMS fabrication method is needed to minimize or avoid these shortcomings of the prior art.

BRIEF DESCRIPTION OF THE DRAWINGS

The features and advantages of the disclosure will readily be appreciated by persons skilled in the art from the following detailed description when read in conjunction with the drawings, wherein.

DETAILED DESCRIPTION OF EMBODIMENTS

Figure 1:
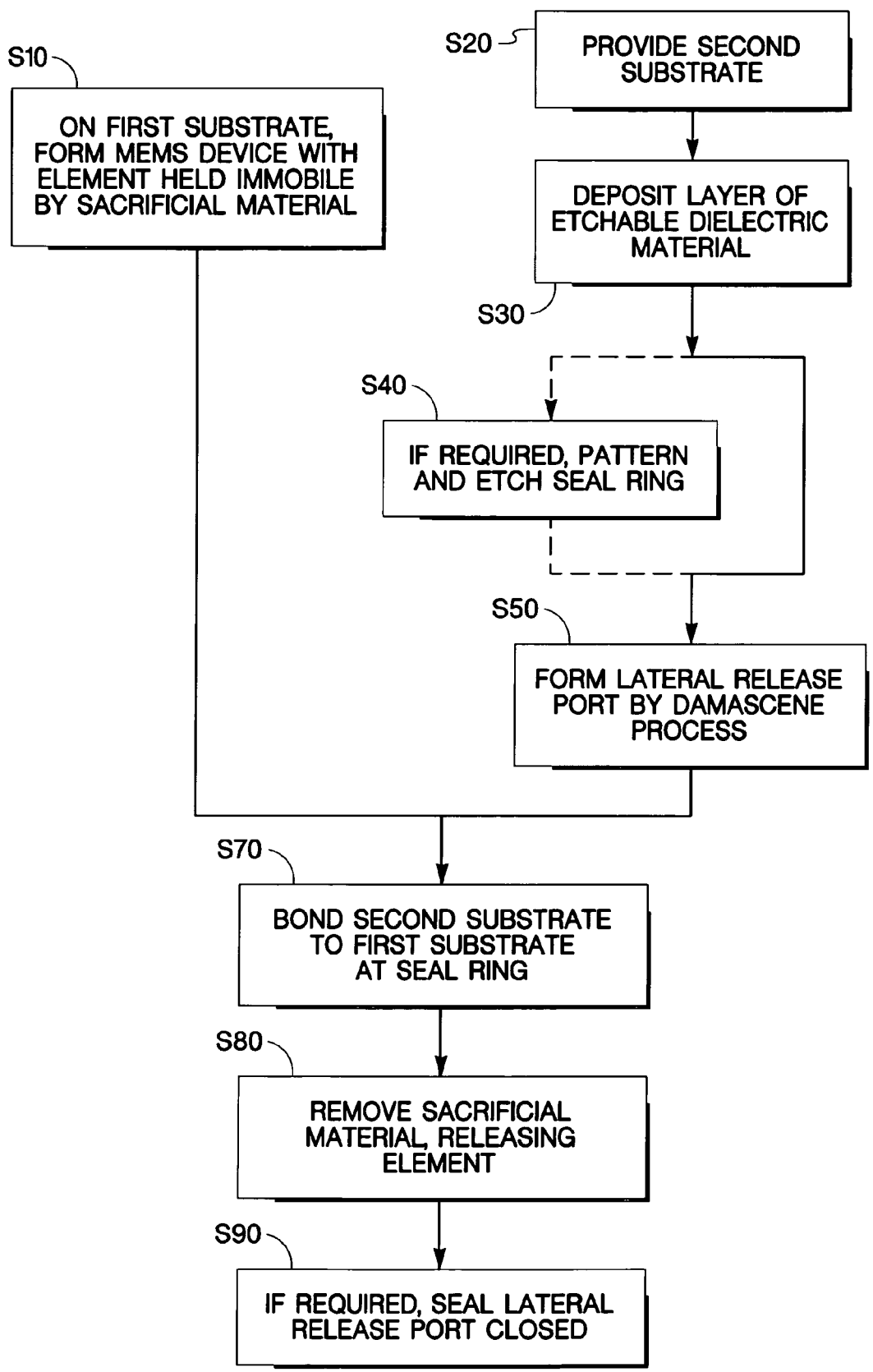
FIG. 1 is a flowchart illustrating an embodiment of an overall method for fabricating MEMS articles.

For clarity of the description, the drawings are not drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the invention can be positioned in a number of different orientations, the directional terminology is used for purposes of illustration and is in no way limiting. The term "lateral" as used herein means generally parallel to a substrate.

The terms "microfabrication" and "MEMS" as used herein are not meant to exclude structures characterized by nanoscale dimensions, i.e., a scale corresponding generally to the scale in the definition of U.S. Patent Class 977, a scale generally less than about 100 nanometers (nm). Nor are these terms meant to exclude methods for making such nanoscale structures.

The term "post-bond" refers to a time after two portions of the article are bonded together. In general, such bonding may comprise any of a number of bonding methods known to those skilled in the art, such as welding, brazing, soldering, anodic bonding, adhesive bonding, or plasma-assisted oxide-to-oxide bonding.

One aspect of the invention provides embodiments of a method for fabricating a MEMS article 10 that requires release of an element initially held immobile by a sacrificial material. One such method embodiment is illustrated by FIG. 1, in which steps are denoted by reference numerals S10-S90. FIGS. 3A-3D and FIGS. 5-7 are side elevation cross-sectional views of embodiments of MEMS articles at various stages of their fabrication. FIG. 4 is a top plan view of an embodiment of a MEMS article.

As shown in FIG. 1, embodiments of the article are made by forming the elements of the MEMS device on a first substrate (step S10), providing a second substrate (step S20), depositing a layer of etchable dielectric material (step S30), patterning and etching a seal ring (step S40) if required for bonding the two substrates to each other, forming at least one lateral post-bond release-etch port by a damascene process using a sacrificial material (step S50), bonding the second substrate to the first substrate (step S70), and removing the sacrificial material through the post-bond release-etch port to release the immobile element (step S80). If a sealed environment for the MEMS device is required, this method embodiment also includes sealing the post-bond release-etch port closed (step S90).

While the embodiment made by the method of FIG. 1 has the lateral release port formed in the second substrate, other embodiments may have the lateral release port formed in the first substrate. If desired, both the first and second substrates may have lateral release ports, although generally ports in one substrate or the other will usually be sufficient.

The first substrate may be a silicon wafer, for example, or any other substrate suitable for forming elements of the MEMS device. The second substrate may be a glass cover, for example, another silicon substrate, or any other substrate suitable for forming a cover for the MEMS article. A glass cover about 0.5 millimeters to about 3 millimeters thick is acceptable for many embodiments, including especially embodiments of MEMS having optical functions that require optical transparency. In the embodiment of FIG. 1, the lateral post-bond release-etch port is formed adjacent to the top surface of the etchable dielectric material deposited on the second substrate. The layer of etchable dielectric material deposited on the second substrate may comprise an oxide, oxynitride, or nitride of silicon, or a combination of those, for example. Specifically, it may comprise a tetra-ethylorthosilicate (TEOS) based oxide, for example. That layer of etchable dielectric material may be made about one to five micrometers thick, for example. The lateral port extends through the seal ring made for bonding to the first substrate.

The sacrificial material used in the damascene process for forming the post-bond release-etch port may be the same sacrificial material used to hold the MEMS element immobile, or it may be a different sacrificial material. The sacrificial material used in the damascene process may be amorphous silicon, for example. Other examples of sacrificial materials suitable for various applications include epoxies, polymers, waxes, photoresists, polyimides, and fluorinated organic polymers such as SiLK (a trademark of Dow Chemical Co., Midland, Mich., for a fluorinated organic polymer material).

Thus, another aspect of the invention is the use of a damascene-type lateral release port temporarily filled with a sacrificial material under a seal ring for MEMS packaging. Such a method of using a damascene-type lateral release port for packaging a MEMS device thus includes disposing the lateral release port under a seal surrounding the MEMS device while temporarily filling the lateral release port with a first sacrificial material, then, after sealing the seal, removing the first sacrificial material from the lateral release port, removing any second sacrificial material from the MEMS article through the lateral release port to release the MEMS device, and finally, sealing the lateral release port closed. A number of such lateral release ports may be used for each MEMS device. An array of MEMS devices may be fabricated on a single substrate such as a silicon wafer, each MEMS device having one or more lateral release ports. The methods disclosed herein may be practiced at a wafer level of processing, i.e., before dicing of the wafer.

To use the method embodiments disclosed herein, fabrication of the MEMS device(s) themselves is substantially completed (except for removal of the sacrificial material which holds one or more of their elements immobile) before the lateral release ports are used.

Figure 2:
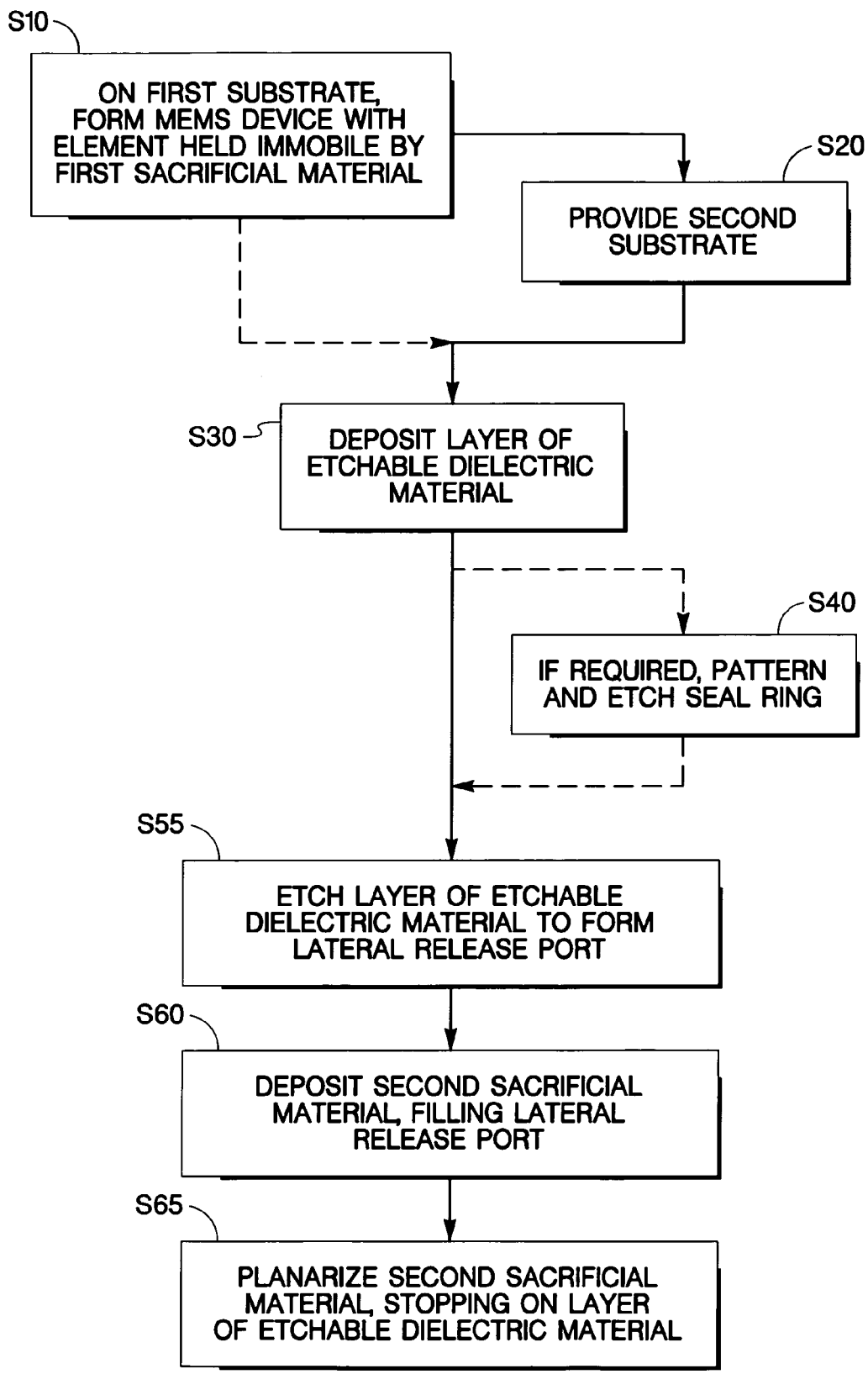
FIG. 2 is a flowchart illustrating an embodiment of an exemplary method for fabricating MEMS articles.

A more detailed method embodiment is illustrated by FIG. 2, in which the steps denoted by reference numerals S10-S40 are essentially the same as the corresponding steps shown in FIG. 1 and described above. In the embodiment illustrated by FIG. 2, the etchable dielectric material layer is etched in step S55 to form a lateral release port. The etching of the layer of etchable dielectric material to form the lateral release port may be performed by etching through the layer of etchable dielectric material to the second substrate or, alternatively, by partially etching into the layer of etchable dielectric material, stopping before the second substrate.

A sacrificial material is deposited in step S60, at least filling the lateral release port. The resulting top surface is planarized in step S65, for example by chemical-mechanical polishing (CMP). Steps S55-S65 together comprise a damascene-type process, similar to step S50 of FIG. 1. The planarization is stopped when the etchable dielectric material layer is planarized along with the sacrificial material, so that the top surface of the sacrificial material filling the lateral release port is even with the top surface of the etchable dielectric material layer, (i.e., the top surfaces of the seal ring and the sacrificial material are made substantially co-planar). Those skilled in the art of damascene processes will understand that some portion of the etchable dielectric material layer thickness may be removed or smoothed by the planarization. The step of patterning and etching a seal ring is performed by patterning and etching the layer of etchable dielectric material.

After the steps of FIG. 2 are completed, the second substrate may be bonded to the first substrate at the seal ring, and the sacrificial material may be removed through the lateral release port to release the immobilized element. A number of alternative processes for bonding the first and second substrates together are known to those skilled in the art, e.g., anodic bonding, silicon fusion bonding, adhesive bonding, zinc bonding, bonding with an intermediate low-melting-point glass, and plasma-assisted oxide-to-oxide bonding.

Again, while the embodiment made by the method of FIG. 2 has the lateral release port formed in the second substrate, other embodiments may have the lateral release port formed by a similar damascene method in the first substrate (instead of or in addition to the lateral release port formed in the second substrate).

The lateral release port may be sealed closed if it is required or desired to enclose the MEMS device in a sealed environment. Sealing of the lateral post-bond release-etch port closed may be performed by various methods, such as laser welding. Alternatively, the lateral release-etch port may be sealed by filling the port with an adhesive material. Another alternative method for sealing the lateral release-etch port is performed by depositing metal (through a shadow mask) over an adhesive material inserted into the port. Yet another alternative method for sealing the lateral release-etch port is performed by pre-forming metallization around the post-bond release-etch port, filling the port with an adhesive material, and covering the adhesive material with a metal solder by soldering to the metallization pre-formed around the port. If a sealed environment for the MEMS device is not required, one or more of the lateral post-bond release-etch ports may be left open. Such open ports may also be used for other functional purposes, such as gas pressure equalization or serving as fluidic communication channels, for example.

It will be appreciated that the methods of the present invention advantageously use deposition, etching, and other process techniques well understood by those skilled in the art. Suitable process parameters, such as pressures, gas flow rates, power, and temperatures, can be readily established for a selected material.

Many types of MEMS articles may be made by embodiments of these methods. Such MEMS articles may include electromechanical motors, high frequency switches, high Q capacitors, pressure transducers, accelerometers, and displays, for example.

Another aspect of the invention provides embodiments of a package for a MEMS device requiring release of an element initially held immobile by a sacrificial material. Embodiments of such a package comprise a first portion carrying the MEMS device and having a first substantially planar surface and a second portion having a second surface with one or more lateral post-bond release-etch ports recessed in the second surface and formed by a damascene process. A seal ring is adapted to bond the second surface to the first surface without blocking the lateral post-bond release-etch port(s), whereby the second portion is bonded to the first portion. If required, the package also includes a quantity of sealing material disposed to seal the lateral post-bond release-etch port(s) after the sacrificial material has been removed through the lateral post-bond release-etch port(s) to release the immobile element.

The first portion of the MEMS package may comprise a silicon substrate, and the second portion of the MEMS package may comprise a glass substrate. If the first portion is a silicon substrate, it may also have a layer of silicon nitride, for instance, covering its top surface. The second portion of the MEMS package may provide a cover for the MEMS device. Also, the second portion may further comprise a layer of etchable dielectric material on the second substrate, the layer of etchable dielectric material having the lateral post-bond release-etch ports recessed in its surface. This layer of etchable dielectric material may comprise an oxide, oxynitride, or nitride of silicon, e.g., a tetraethylorthosilicate (TEOS) based oxide, about one to about five micrometers thick. The lateral post-bond release-etch ports recessed in the surface of the layer of etchable dielectric material are formed by a damascene process and may extend through the layer of etchable dielectric material to the glass substrate, or may extend only partially into the layer of etchable dielectric material. The second surface is bonded to the first surface without blocking the lateral post-bond release-etch port(s). Thus, the second portion of the package for a MEMS device is bonded to the first portion.

The new MEMS packaging structure allows the release of MEMS structures from sacrificial materials after substantial packaging of the MEMS device is accomplished. No holes are made in the cover.

Figure 3A:
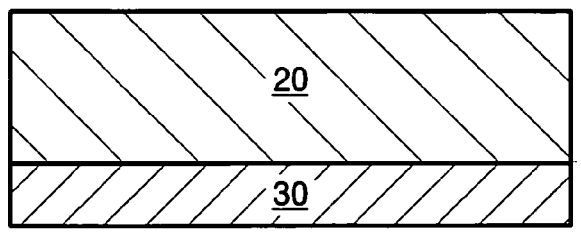
FIGS. 3A-3D are side elevation cross-sectional views of an embodiment of a MEMS article at various stages of its fabrication.
Figure 3B:
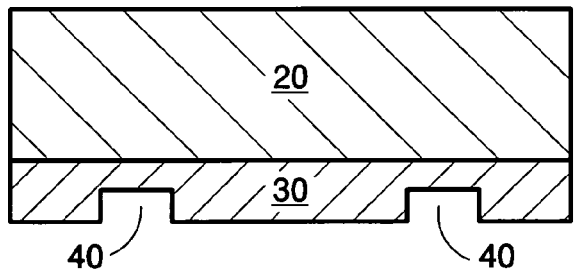
Figure 3C:
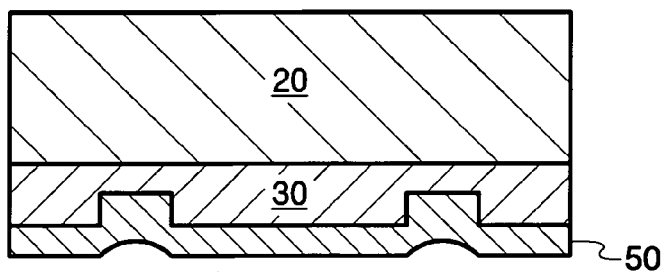
Figure 3D:
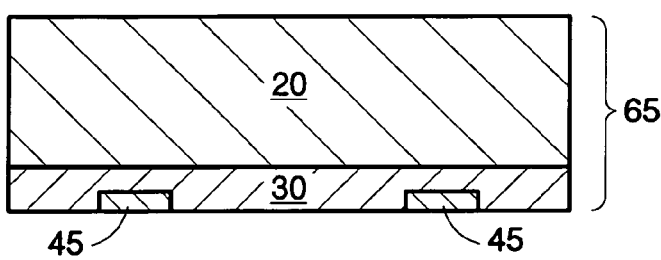
Figure 4:
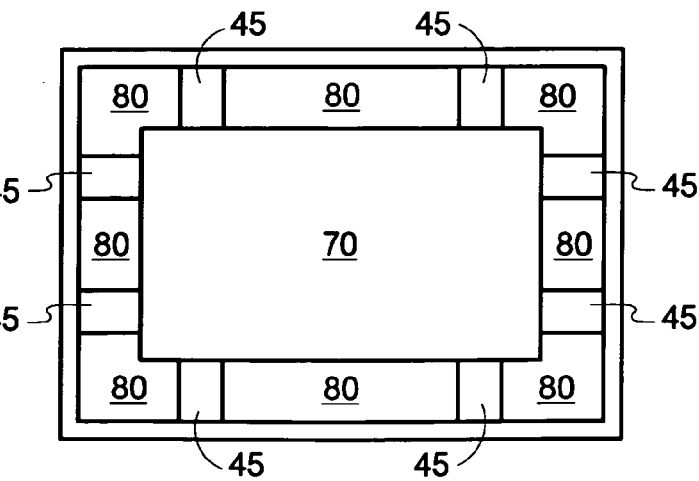
FIG. 4 is a top plan view of an embodiment of a MEMS article.

FIGS. 3A-3D and FIGS. 5-7 are side elevation cross-sectional views of embodiments of MEMS articles at various stages of their fabrication. FIG. 3A shows a substrate 20 for a cover, with a layer of etchable dielectric material 30 such as an oxide, oxynitride, or nitride of silicon (e.g., TEOS oxide). FIG. 3B shows openings 40 formed by etching into etchable dielectric material layer 30 as a step (S45 in FIG. 2) in the damascene method of forming lateral release ports. While FIG. 3B shows opening 40 etched to a depth of less than the thickness of etchable dielectric material layer 30, other embodiments may have openings 40 etched completely through etchable dielectric material layer 30 to substrate 20. FIG. 3C shows a sacrificial material 50 deposited over the etchable dielectric material 30 and openings 40, at least filling openings 40 (step S55 in FIG. 2). FIG. 3D shows the structure after planarization (step S65 in FIG. 2), resulting in a planar surface 60. The resultant surfaces of etchable dielectric material layer 30 and sacrificial material 50 filling lateral-release-port openings 40 are coplanar at the planarized surface 60. This completes the damascene method used for forming the sacrificial-material-filled lateral release ports 45, and completes a cover sub-assembly 65.

FIG. 4 is a top plan view of an embodiment of a MEMS article structure after cover sub-assembly 65 is placed over the previously fabricated MEMS device(s). In this embodiment, there is an array 70 of individual MEMS device(s) on their substrate 90 with a seal ring 80 surrounding the array of individual MEMS devices, and a number of sacrificial-material-filled lateral release ports 45 extending laterally over the seal ring 80.

Figure 5:
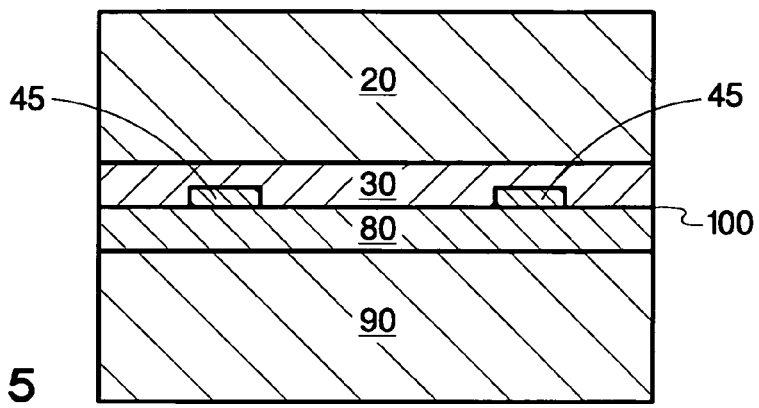
FIGS. 5-7 are further side elevation cross-sectional views of an embodiment of a MEMS article at various stages of its fabrication.
Figure 6:
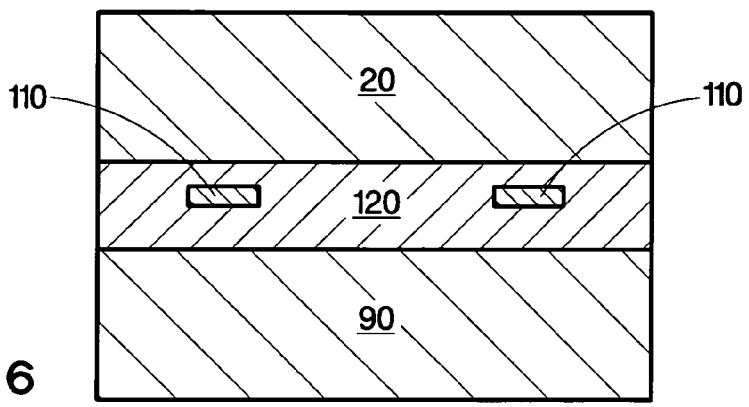
Figure 7:
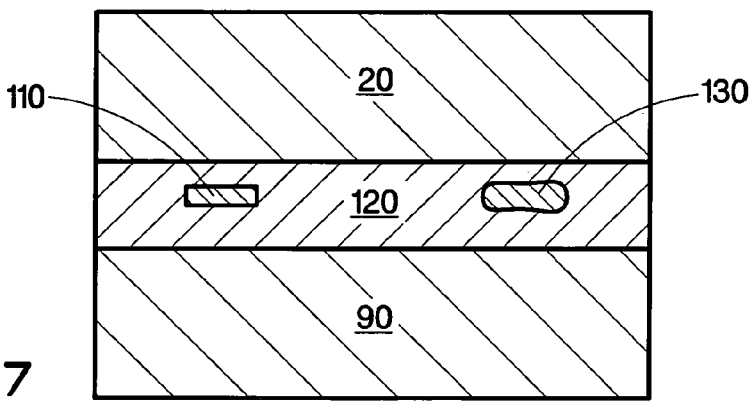
Figure 8:
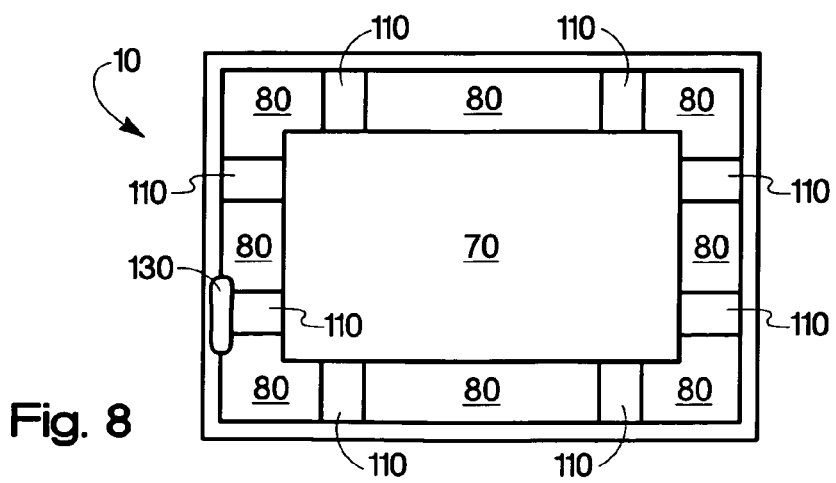
FIG. 8 is a top plan view of an embodiment of a MEMS article, illustrating one embodiment of a port seal.

FIG. 5 shows the assembled article in a side elevation cross-sectional view after bonding at a planar bond interface 100. For clarity, the MEMS devices themselves are not shown in FIGS. 5-7. After bonding, there is a completed bond seal 120. FIG. 6 shows the side elevation cross-sectional view after removal of sacrificial material 50 by etching, leaving open lateral release ports 110. The same etch (or a subsequent etch) through open lateral release ports 110 also releases the immobilized elements of the MEMS devices. FIG. 7 shows the structure of FIG. 6 after one of the lateral release ports 110 has been closed by a port seal 130. FIG. 8 shows a top plan view of an embodiment of a nearly completed MEMS article 10, illustrating one embodiment of a port seal 130. Generally, either all the lateral release ports 110 are sealed if the MEMS device requires a sealed environment, or none of the lateral release ports 110 are sealed if the MEMS device doesn't require a sealed environment. However, some applications are envisioned which require a subset of the lateral release ports 110 to be left open (either permanently or temporarily) as shown in FIG. 8. For example, some or all of the lateral release ports 110 may be left open temporarily for introduction into the package of anti-stiction materials or other vapor-deposited materials that help MEMS functionality.

Figure 9:
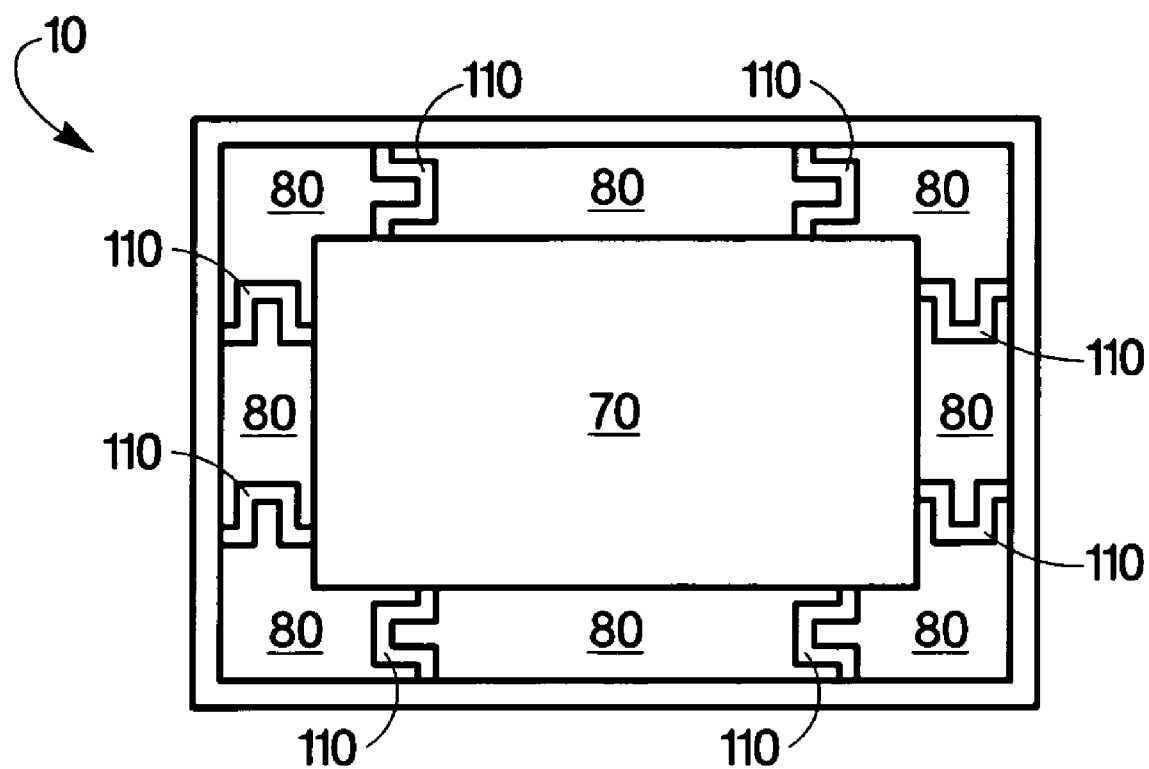
FIG. 9 is a top plan view of an embodiment of a MEMS article, illustrating an alternative embodiment of lateral post-bond release-etch ports.

FIG. 9 is a top plan view of an embodiment of a MEMS article, illustrating an alternative embodiment of a lateral post-bond release-etch port 110. The lateral post-bond release-etch port 110 of FIG. 9 has a serpentine configuration, which allows removal of the sacrificial material(s), but blocks line-of-sight access to the interior of the completed MEMS article from outside the package.

Thus, in an exemplary embodiment of the overall fabrication process, the MEMS structures are completed on a silicon wafer without release of the sacrificial material that holds elements immobile. A glass lid is prepared with lateral ports. The lid and the silicon wafer are plasma treated and bonded to form an oxide-to-oxide bond. The assembly is then placed in an etching chamber (a $XeF_2$ etcher, for example, if amorphous silicon is used as the sacrificial material). The etchant attacks sacrificial material that is laterally exposed around one or more peripheral areas in the seal ring, and proceeds until all the required sacrificial material is etched from the MEMS array, i.e., until the MEMS structures are released. If required, anti-stiction materials or other vapor-deposited constituents are introduced through the lateral ports before they are sealed. Finally, the lateral etch ports may be sealed by either non-hermetic adhesives, or by employing hermetic processes, such as soldering, glass laser welding, or other schemes.

Unlike the standard MEMS processing which includes release etching before bonding, the MEMS structures of the present invention are not exposed to ambient conditions which can lead to particulate and chemical contamination before they are packaged. The packaging process cannot cause particulate exposure on the MEMS devices. Thermal excursions of the bonding process cannot greatly strain the MEMS devices because during bonding they are still encapsulated in sacrificial material such as amorphous silicon. Ultraviolet (UV) adhesives can be utilized for non-hermetic packaging, if desired, since the MEMS are protected by the encapsulating sacrificial material from outgassing or UV radiation. Anodic bonding can be utilized, if desired, since the MEMS devices are held firmly in place and cannot "snap-down" from electrostatic forces. Anti-stiction coating can be applied by CVD process into the lateral post-release ports.

Another aspect of the invention is a method of using a MEMS device requiring release of an element initially held immobile by a sacrificial material. This method includes carrying the MEMS device on a substrate having a first surface. The MEMS device is covered with a cover having a second surface with one or more post-bond release-etch ports recessed in it, formed by a damascene process. The second surface is bonded to the first surface without blocking any of the post-bond release-etch ports. The sacrificial material is removed through the post-bond release-etch port(s) to release the immobile element before sealing the post-bond release-etch port(s) if such sealing is required.

INDUSTRIAL APPLICABILITY

Methods performed in accordance with the invention are useful in fabrication of many kinds of MEMS articles. Such MEMS articles may include high-frequency switches, high-Q capacitors, electromechanical motors, pressure transducers, accelerometers, and displays, for example. MEMS articles made in accordance with the invention are useful in many other sensor, actuator, and display applications, for example. The methods may be practiced on a wafer scale (i.e., before any dicing or singulation).

Although the foregoing has been a description and illustration of specific embodiments of the invention, various modifications and changes thereto can be made by persons skilled in the art without departing from the scope and spirit of the invention as defined by the following claims. For example, functionally equivalent materials may be substituted for the specific materials described in the embodiments, and the order of steps may be varied somewhat. For another example, before sealing the first and second substrates together, a portion of the sacrificial material may be removed (e.g., by partial etching, which may be a wet etch) without releasing the immobilized element(s), leaving an amount of sacrificial material sufficient to hold the element (s) immobile until they are released later, after bonding the substrates as described herein. For some applications, various elements may be released at different times in the fabrication process, some may be released before bonding of the two substrates together, and some may be released after bonding, e.g., by using different sacrificial materials.

What is claimed is:

1. A method for fabricating a MEMS article requiring release of an element initially held immobile by a first sacrificial material, the method comprising the steps of:
    a) forming a MEMS device on a first substrate,
    b) providing a second substrate,
    c) depositing a layer of etchable dielectric material on at least one of the first and second substrate,
    d) forming at least one lateral post-bond release-etch port by a damascene process using a second sacrificial material deposited over the etchable dielectric material, and
    e) bonding the second substrate to the first substrate.

2. The method of claim 1, wherein the first sacrificial material is suitably disposed to temporarily hold the element immobile.

3. The method of claim 1, further comprising the step of:
    f) patterning and etching a seal ring for bonding the first and second substrates together, and wherein the step e) of bonding the second substrate to the first substrate is performed by bonding at the seal ring.

4. The method of claim 1, further comprising the step of:
    g) removing the first and second sacrificial materials through the at least one post-bond release-etch port to release the element initially held immobile.

5. The method of claim 1, further comprising the step of:
    h) sealing the post-bond release-etch port closed.

6. The method of claim 1, wherein the first substrate comprises silicon.

7. The method of claim 1, wherein the second substrate comprises a glass.

8. The method of claim 1, wherein the second sacrificial material comprises the same material as the first sacrificial material.

9. The method of claim 1, wherein the second sacrificial material comprises a material differing from the first sacrificial material.

10. The method of claim 1, wherein the second sacrificial material comprises a material selected from the list consisting of amorphous silicon, epoxies, polymers, waxes, photoresists, polyimides, fluorinated organic polymers, and combinations thereof.

11. The method of claim 1, wherein the layer of etchable dielectric material comprises a material selected from the list consisting of oxides, oxynitrides, and nitrides of silicon, a tetraethylorthosilicate (TEOS) based oxide, and combinations thereof.

12. The method of claim 1, wherein the steps are performed in the order recited.

13. The method of claim 1, performed on a water scale, before any dicing or singulation.

14. A MEMS article made by the method of claim 1.

15. A method for fabricating a MEMS article including an element initially held immobile by a sacrificial material, the method comprising the steps of:
   a) forming a MEMS device on a first substrate,
   b) providing a second substrate,
   c) depositing and patterning a layer of etchable dielectric material on at least one of the first and second substrate,
   d) patterning and etching the layer of etchable dielectric material to form at least one post-bond release-etch port,
   e) depositing a layer of amorphous silicon, at least filling the at least one post-bond release-etch port,
   f) planarizing the layer of amorphous silicon, stopping on the layer of etchable dielectric material, and
   g) patterning and etching a seal ring for sealing to the first substrate.

16. The method of claim 15, wherein the MEMS device formed on the first substrate initially includes the sacrificial material suitably disposed to hold the element temporarily immobile.

17. The method of claim 15, wherein the layer of etchable dielectric material comprises a layer about one micrometer to about five micrometers thick.

18. The method of claim 15, wherein the step d) of patterning and etching the layer of etchable dielectric material to form post-bond release-etch ports is performed by etching through the layer of etchable dielectric material to the second substrate.

19. The method of claim 15, wherein the step d) of patterning and etching the layer of etchable dielectric material to form post-bond release-etch ports is performed by partially etching into the layer of etchable dielectric material, stopping before the second substrate.

20. The method of claim 15, wherein the step f) of planarizing the layer of amorphous silicon is performed by chemical-mechanical polishing (CMP).

21. The method of claim 15, wherein the step g) of patterning and etching a seal ring is performed by patterning and etching the layer of etchable dielectric material.

22. The method of claim 15, wherein the steps are performed in the order recited.

23. A MEMS article made by the method of claim 15.

24. The method of claim 15, further comprising the steps of:
   h) bonding the second substrate to the first substrate at the seal ring, and
   i) removing the sacrificial material through the at least one post-bond release-etch port to release the immobile element.

25. A MEMS article made by the method of claim 24.

26. The method of claim 24, further comprising the step of:
   j) sealing the post-bond release-etch port closed.

27. A MEMS article made by the method of claim 26.

28. A package for a MEMS device, the package comprising:
   a) a first portion carrying the MEMS device and having a first surface,
   b) a second portion having a second surface,
   c) at least one post-bond rerease-etch port, formed by a damascene process and recessed in at least one of the first surface and the second surface, and
   d) a seal ring adapted to bond the second surface to the first surface without blocking the at least one post-bond release-etch port, whereby the second portion is bonded to the first portion.

29. The package of claim 28, further comprising:
   e) a quantity of sealing material disposed to seal the at least one post-bond release-etch port.

30. The package of claim 28, wherein the first portion carrying the MEMS device indudes an element initially held immobile by a sacrificial material.

31. The package of claim 30, further comprising:
   e) a quantity of sealing material disposed to seal the at least one post-bond release-etch port after the sacrificial material has been removed through the at least one post-bond release-etch port to release the element initially held immobile.

32. The package of claim 28, wherein the first portion comprises a silicon substrate.

33. The package of claim 32, wherein the first portion further comprises a layer of etchable dielectric material on the silicon substrate, the layer of etchable dielectric materiar having the post-bond release-etch ports recessed in the surface thereof.

34. The package of claim 33, wherein the post-bond release-etch ports recessed in the surface of the layer of etchable dielectric material extend through the layer of etchable dieiectric material to the silicon substrate.

35. The package of claim 28, wherein the second portion comprises a glass substrate.

36. The package of claim 35, wherein the second portion further comprises a layer of etchable dielectric material on the grass substrate, the layer of etchable dielectric material having the post-bond release-etch ports recessed in the surface thereof.

37. The package of claim 36, wherein the post-bond release-etch ports recessed in the surface of the layer of etchable dielectric material extend through the layer of etchable dielectric material to the glass substrate.

38. The method of claim 36, wherein the layer of etchable dielectric material comprises a material selected from the list consisting of oxides, oxynitrides, and nitrides of silicon, a tetraethylorthosilicate (TEOS) based oxide, and combinations thereof.

39. The package of claim 36, wherein the layer of etchable dielectric material comprises a layer about one micrometer to about five micrometers thick.

40. The package of claim 28, wherein at least one post-bond release-etch port has a serpentine configuration.

41. A package for a MEMS device, the package comprising, in combination:
   a) means for carrying the MEMS device, the means for carrying having a first surface,
   b) means for covering the MEMS device, the means for covering having a second surface, c) at least one post-bond release-etch port formed by a damascene process and recessed in at least one of the first surface and the second surface, and d) means for bonding the second surface to the first surface, whereby the second portion is bonded to the first portion without blocking the at least one post-bond release-etch port.

42. The package of claim 41, wherein the MEMS device includes an element initially held immobile by a sacrificial material, the package further comprising:

e) means for sealing the at least one post-bond release-etch port after the sacrificial material has been removed through the at least one post-bond release-etch port to release the immobile element.

43. A method of using a MEMS device, the method comprising the steps of:

a) carrying the MEMS device on a substrate having a first surface, b) covering the MEMS device with a cover having a second surface, c) providing at least one lateral post-bond release-etch port formed by a damascene process and recessed in at least one of the first and second surfaces, and d) bonding the second surface to the first surface without blocking the at least one lateral post-bond release-etch port.

44. The method of claim 43, wherein the MEMS device includes at least one element initially held immobile by a sacrificial material, the method further comprising the step of:

e) removing the sacrificial material through the at least one lateral post-bond release-etch port to release the immobile element.

45. The method of claim 44, further comprising the step of:

f) sealing the at least one lateral post-bond release-etch port after removing the sacrificial material.

* * * * *

UNITED STATES PATENT AND TRADEMARK OFFICE
CERTIFICATE OF CORRECTION

PATENT NO.          : 7,288,464 B2                                         Page 1 of 1
APPLICATION NO.  : 11/104704
DATED                   : October 30, 2007
INVENTOR(S)         : Charles C. Haluzak et al.

It is certified that error appears in the above-identified patent and that said Letters Patent is hereby corrected as shown below:

In column 9, line 13, in Claim 13, delete "water" and insert -- wafer --, therefor.

In column 10, line 11, in Claim 28, delete "rerease" and insert -- release --, therefor.

In column 10, line 22, in Claim 30, delete "indudes" and insert -- includes --, therefor.

In column 10, line 34, in Claim 33, delete "materiar" and insert -- material --, therefor.

In column 10, line 40, in Claim 34, delete "dieiectric" and insert -- dielectric --, therefor.

In column 10, line 45, in Claim 36, delete "grass" and insert -- glass --, therefor.

Signed and Sealed this

Twenty-fifth Day of November, 2008

JON W. DUDAS
*Director of the United States Patent and Trademark Office*